United States Patent [19]
Hirano

[11] Patent Number: 5,309,024
[45] Date of Patent: May 3, 1994

[54] MULTILAYER PACKAGE

[75] Inventor: Naohiko Hirano, Yokohama, Japan

[73] Assignee: Kabushiki Kaisha Toshiba, Kawasaki, Japan

[21] Appl. No.: 893,807

[22] Filed: Jun. 4, 1992

[30] Foreign Application Priority Data

Jun. 6, 1991 [JP] Japan .................................. 3-134613
May 29, 1992 [JP] Japan .................................. 4-139006

[51] Int. Cl.$^5$ ..................... H01L 23/48; H01L 29/46; H01L 29/62; H01L 29/64
[52] U.S. Cl. .................... 257/773; 257/786; 257/691; 257/665; 257/697; 257/678; 257/774
[58] Field of Search ............... 257/697, 678, 691, 665, 257/773, 786, 774

[56] References Cited

U.S. PATENT DOCUMENTS

| | | | |
|---|---|---|---|
| 4,698,663 | 10/1987 | Subimoto et al. | 257/697 |
| 4,943,845 | 7/1990 | Wilby | 257/697 |
| 5,066,831 | 11/1991 | Spielberger et al. | 257/786 |
| 5,126,828 | 6/1992 | Hatta et al. | 257/786 |
| 5,173,766 | 12/1992 | Long et al. | 257/687 |

FOREIGN PATENT DOCUMENTS

| | | | |
|---|---|---|---|
| 59-161843 | 9/1984 | Japan | 257/697 |
| 2-239649 | 9/1990 | Japan | 257/697 |

OTHER PUBLICATIONS

IBM TDB vol. 30, No. 6 Nov. 1987 High Performance Multi-Chip Module pp. 437-439.
IEPS Proceedings (1988) M. A. Schmitt et al., "Current Distribution in Power and Ground Planes of a Multilayer Pin Grid Array Package" pp. 467-475.
IEEE (1989) 0569-5503/89/0384-U. A. Shrivastava et al., "Inductance Calculation and Optimal Pin Assignment for the Design of Pin Grid Array and Chip-Carrier Packages" pp. 384-391.

Primary Examiner—Jerome Jackson
Assistant Examiner—T. M. Arroyo
Attorney, Agent, or Firm—Finnegan, Henderson, Farabow, Garrett & Dunner

[57] ABSTRACT

The present invention provides a multilayer ceramic package, which comprises a conductive layer, formed like a square layer, applying a power voltage $V_{DD}$ or a ground voltage $V_{SS}$ to a semiconductor device, and having a square hole in its central portion, a plurality of inner leads connected to the conductive layer at the inner portion of the conductive layer, and a plurality of outer leads connected to the conductive layer at the outer portion of the conductive layer, wherein if a first contact point between the inner lead and the conductive layer, a second contact point between the outer lead and conductive layer, a distance between adjacent two first contact points is $C_1$, a distance between adjacent two second contact points is $C_2$, a shortest distance from the first contact point to the second contact point is h, both $C_1/h$ and $C_2/h$ are $\frac{3}{8}$ or less.

21 Claims, 21 Drawing Sheets

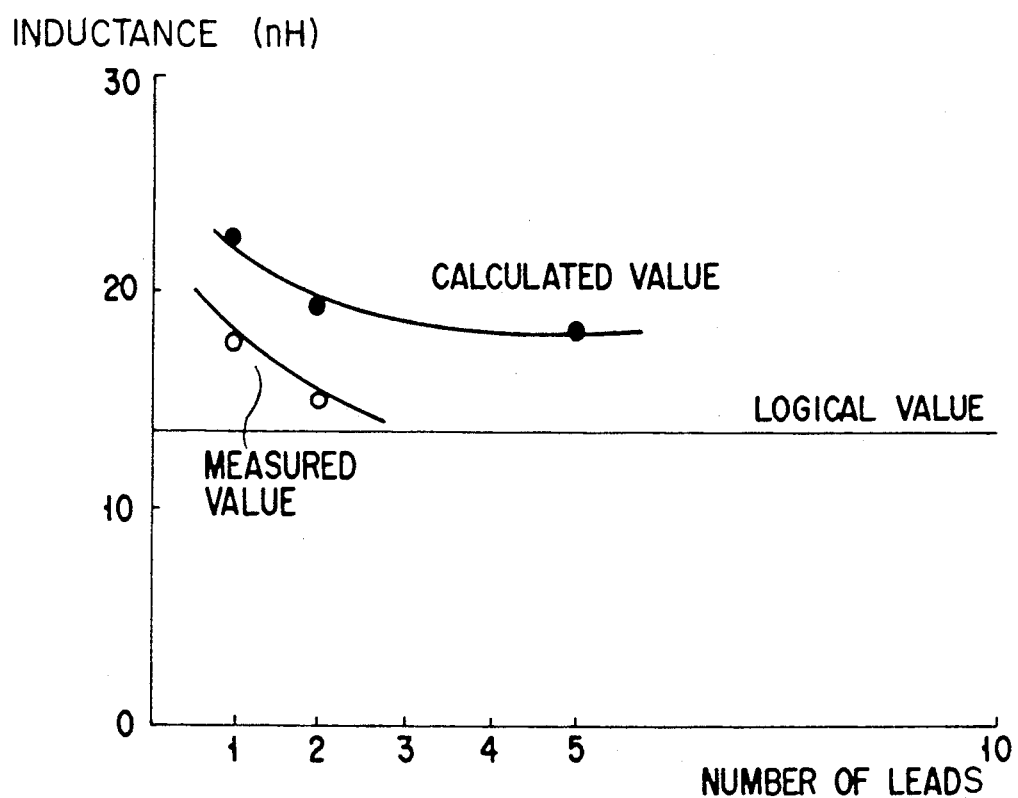
F I G. 3

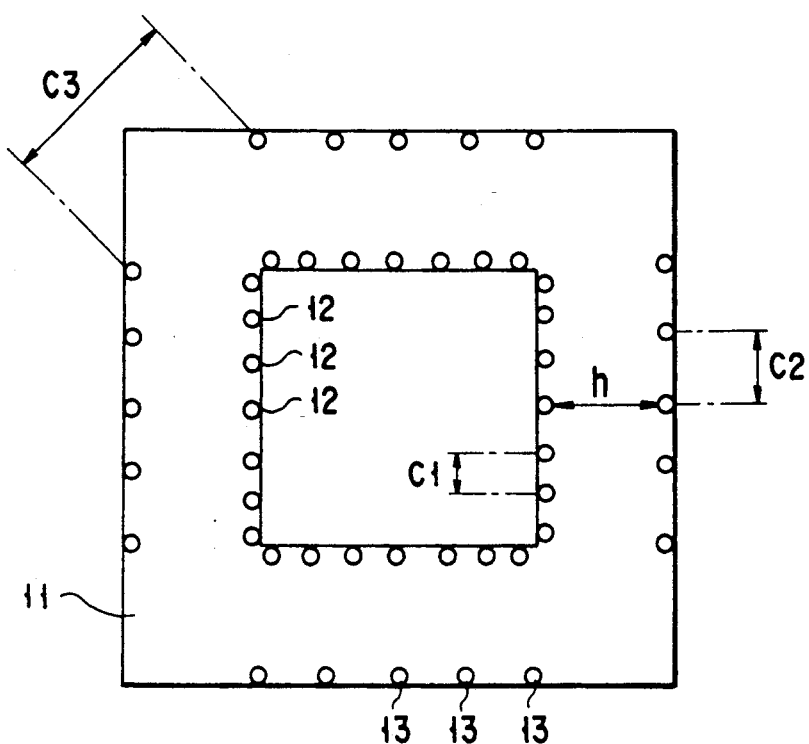
F I G. 4A
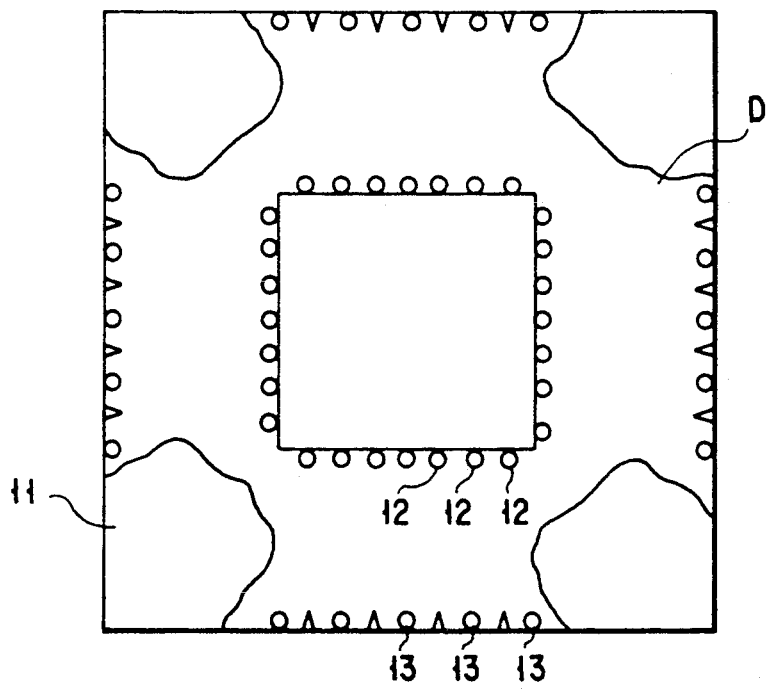
F I G. 5

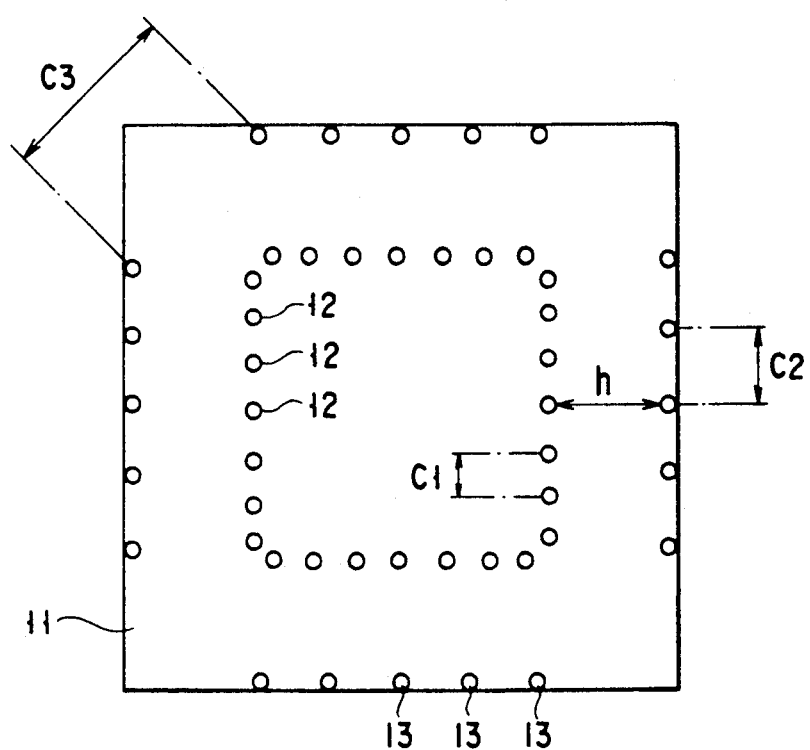
F I G. 4B

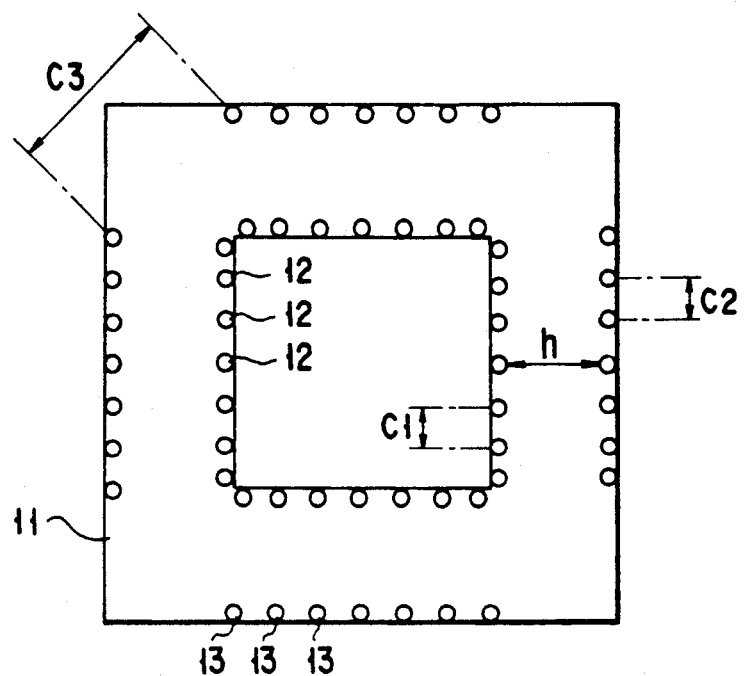
F I G. 7A
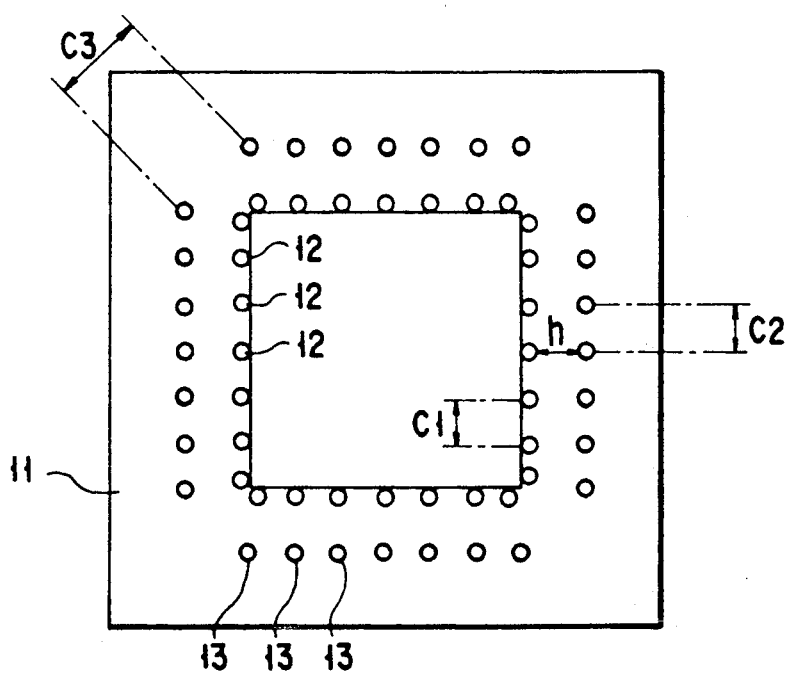
F I G. 8A

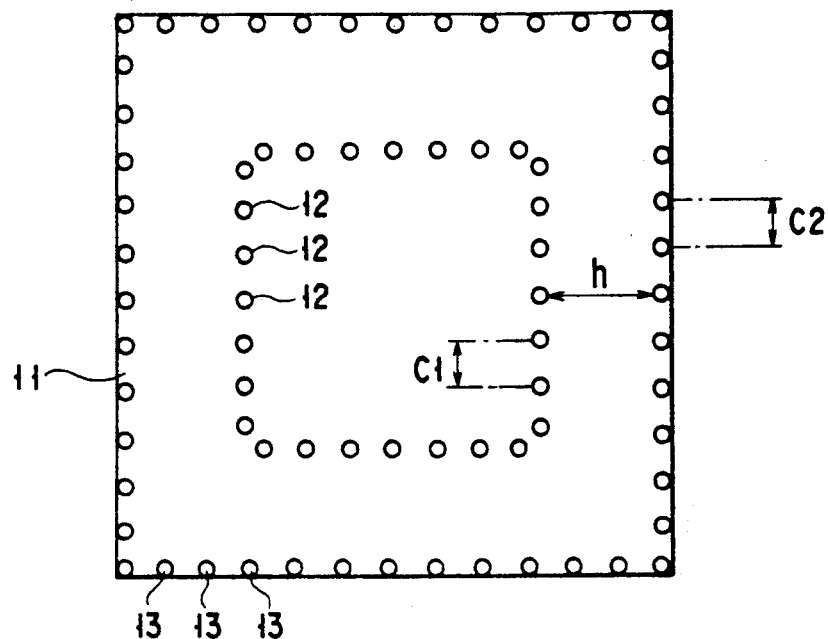
F I G. 9B
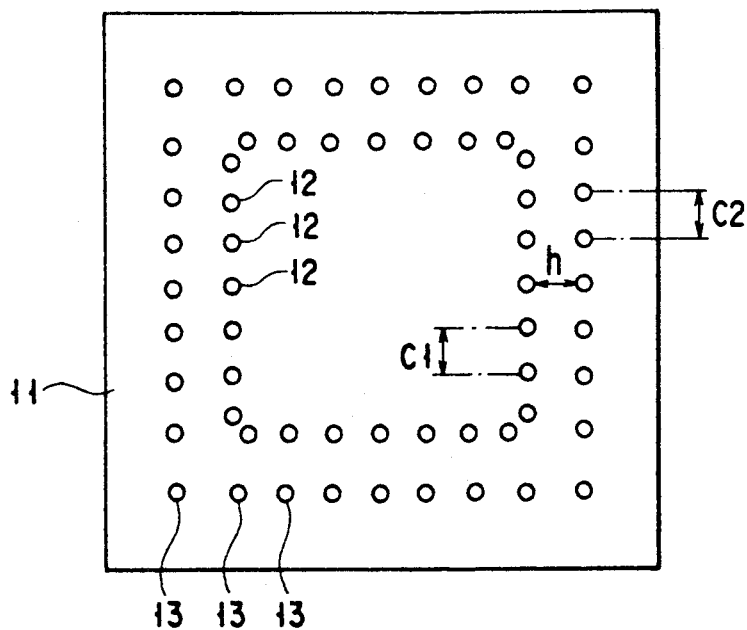
F I G. 10B

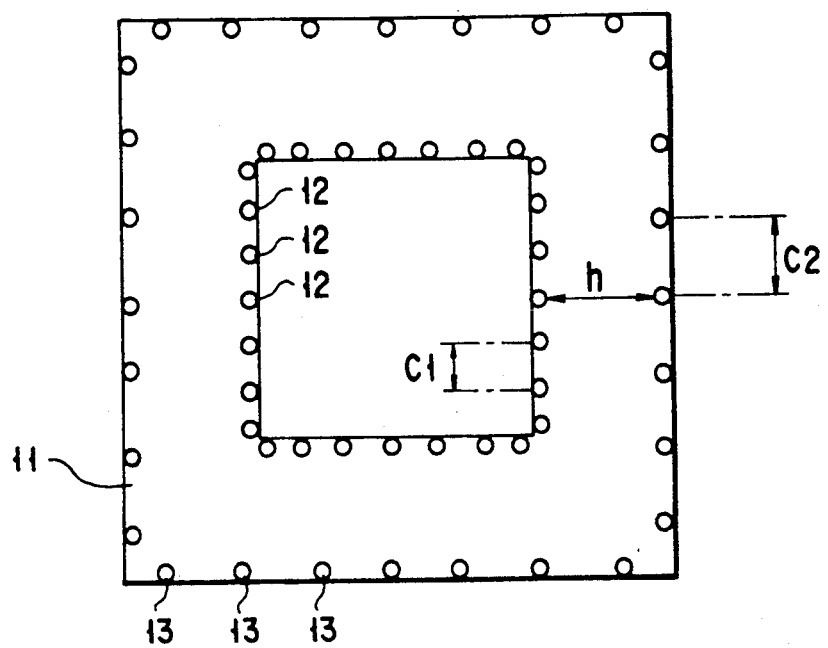
F I G. 11A
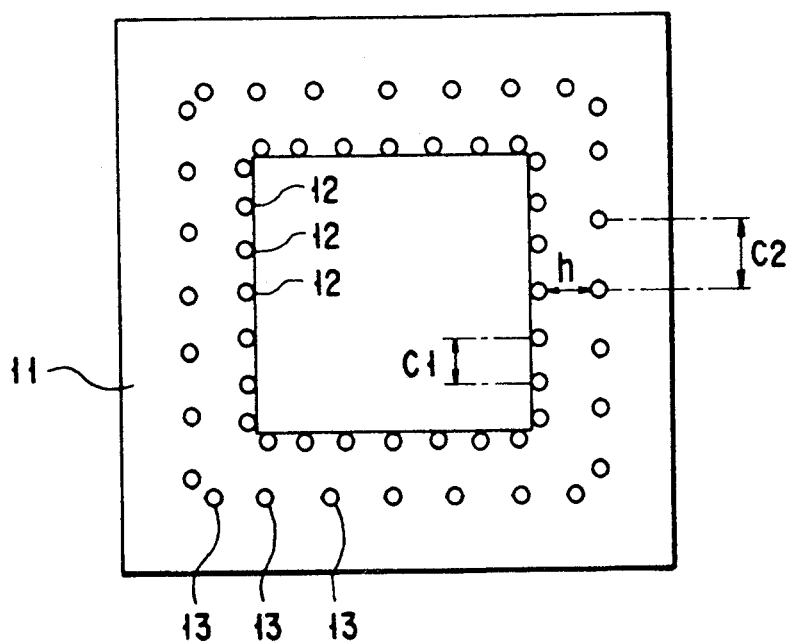
F I G. 12A

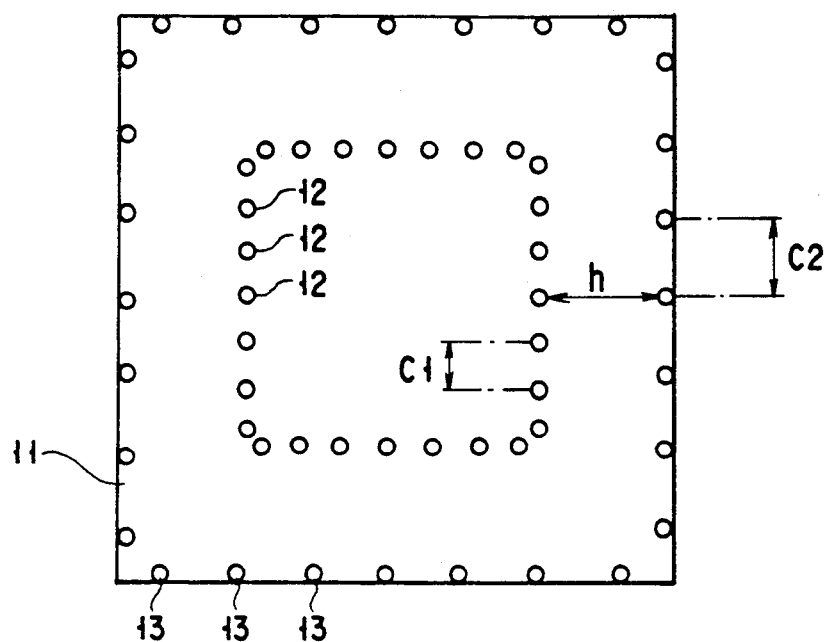
F I G. 11B
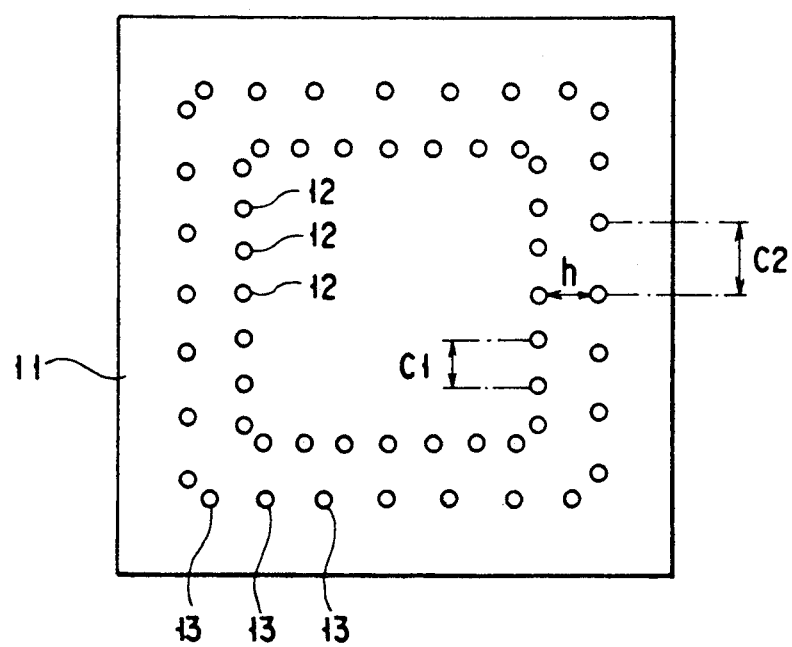
F I G. 12B

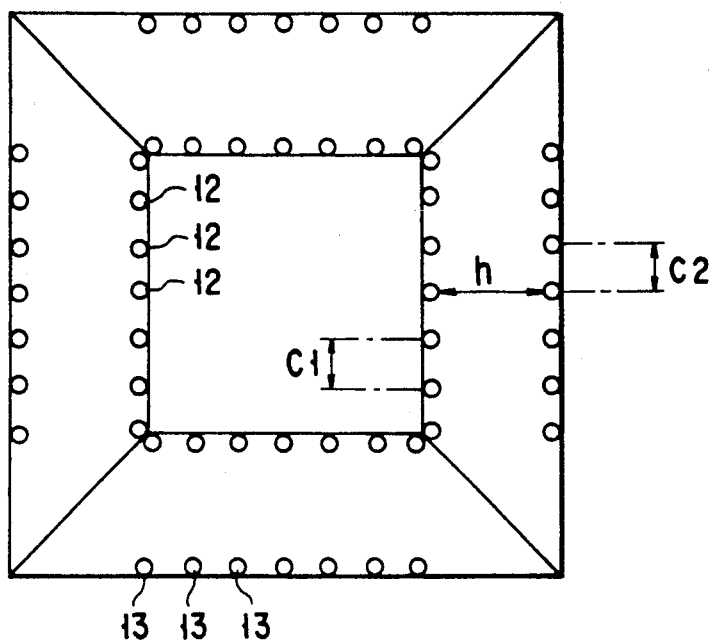
F I G. 15A
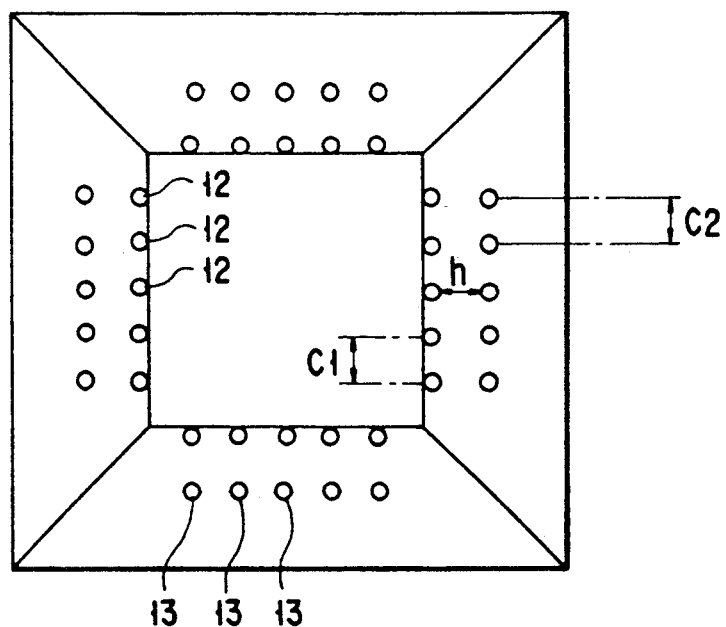
F I G. 16A

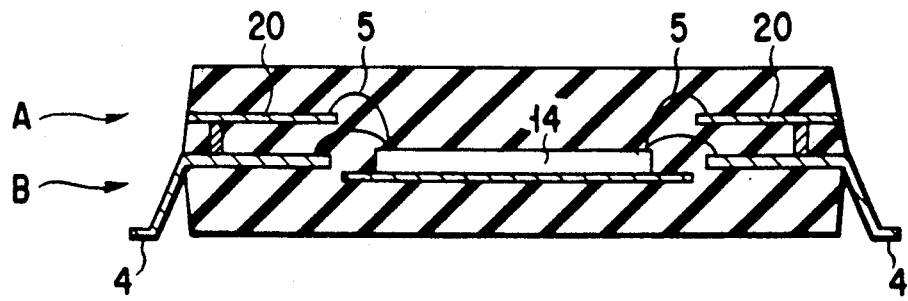
F I G. 22
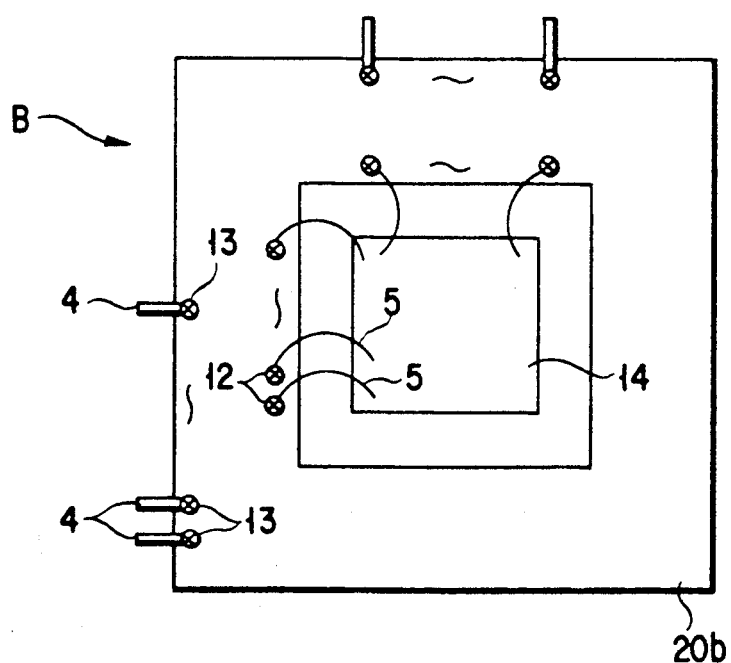
F I G. 23

MULTILAYER PACKAGE

BACKGROUND OF THE INVENTION

1. Field of the Invention

The present invention relates to improvement of a conductive layer for a power voltage $V_{DD}$ or a ground voltage $V_{SS}$ using a multilayer plastic package and a multilayer ceramic package such as a pin grid array package (PGA).

2. Description of the Related Art

Conventionally, in a multilayer ceramic package such as a pin grid array package (PGA), a conductive layer (hereinafter called simply as conductive layer) for supplying a power voltage $V_{DD}$ or a ground voltage $V_{SS}$ to a semiconductor device (IC chip) is structured as shown in FIG. 1.

That is, in FIG. 1, a conductive layer 11 comprises a square layer-like conductor. In the central portion of the conductive layer 11, a square hole is formed. In the end portion of the inside of the conductive layer 11, contact points 12 to be connected to an inner lead are formed. The contact points 12 are irregularly arranged due to a bonding pad formed in the inner lead. Therefore, the distance among the contact points 12 differs.

In the end portion of the outside of the conductive layer 11, contact points 13 to be connected to an outer lead for a power voltage source or a ground pin are formed. The contact points 13 are irregularly arranged due to the other outer lead for a signal pin. Therefore, similar to the contact points 12, the distance among the contact points 13 differs.

In the conventional multilayer ceramic package, the positions and the number of the contact points 12 and 13 are determined regardless of the shape of the conductive layer 11. In other words, in conventional, neither the rule of the arranging method of the contact points 12 and 13 nor the rule of the setting method of the number of the leads exists.

In the state that no constant rule exists, if a plurality of output buffers, which are formed in the IC chip in the package, are turned on at the same time, a large current must be supplied to the IC chip during a short period of time in order to normally drive the plurality of the output buffers. In this case, in the conventional package, the current flowing in the conductive layer 11 becomes uneven, the power voltage $V_{DD}$ or the ground voltage $V_{SS}$ largely varies. This variation becomes the so-called simultaneous switching noise, thereby causing an erroneous operation of an input buffer or that of a logic circuit.

FIG. 2 shows a distribution of current density of the conductive layer 11 for the ground voltage $V_{SS}$ and current is dense in an area D.

SUMMARY OF THE INVENTION

In order to eliminate the above problem, the present invention has been made, and an object of the present invention is to provide a multilayer ceramic package wherein a distribution of current density of a conductive layer for a power voltage $V_{DD}$ or a ground voltage $V_{SS}$ is uniformed and conductor resistance and inductance are reduced and simultaneous switching noise is also reduced, and delay of an output signal in an output buffer is reduced.

In order to attain the above object, according to the multilayer ceramic package of the present invention, a conductive layer for supplying a power voltage $V_{DD}$ or a ground voltage $V_{SS}$ to a semiconductor device is connected to a plurality of inner leads and a plurality of outer leads. The shape of the conductive layer is squire layer-like, and a square hole is formed in the central portion of the conductive layer. Each inner lead is connected to the conductive layer at the end portion of the inside of the conductive layer. Each outer lead may be connected to the conductive layer at the portion other than the end portion of the outside of the conductive layer. The distance between the nearest neighboring two contact points of the inner lead is ⅜ or less of the shortest distance from one contact point of the inner lead to one contact point of the outer lead. Similarly, the distance between the nearest neighboring two contact points of the outer lead is ⅜ or less of the shortest distance from one contact point of the inner lead to one contact point of the outer lead.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 3 shows a relationship between the number of leads and inductance;

FIGS. 4A and 4B are plane views showing the position of contact points between a conductive layer and a lead of a multilayer package of the present invention;

FIG. 5 is a view showing a distribution of current density in the conductive layer of FIG. 4A;

FIGS. 6A to 16B and FIGS. 17 and 18 are plane views each showing the position of contact points between the conductive layer and the lead of the multilayer package of the present invention;

FIG. 22 is a cross sectional view of the multilayer plastic package of FIG. 21;

FIGS. 23 and 24 are plane views showing the multilayer plastic package according to the other embodiment of the present invention.

DETAILED DESCRIPTION OF THE PREFERRED EMBODIMENTS

An embodiment of the present invention will be explained with reference to the drawings.

Figure 19:
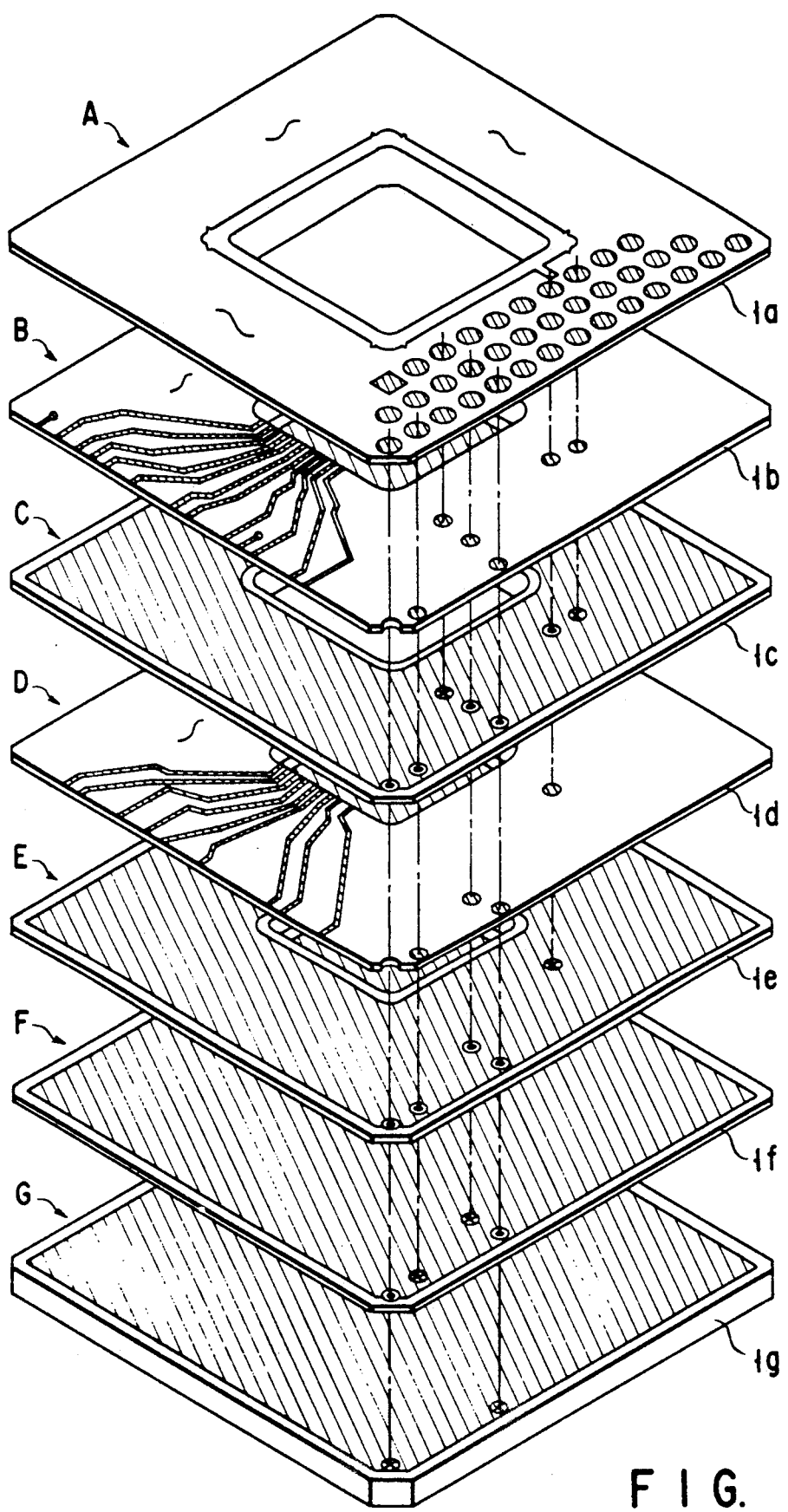
FIG. 19 is an exploded perspective view showing a multilayer ceramic package according to one embodiment of the present invention.
Figure 20:
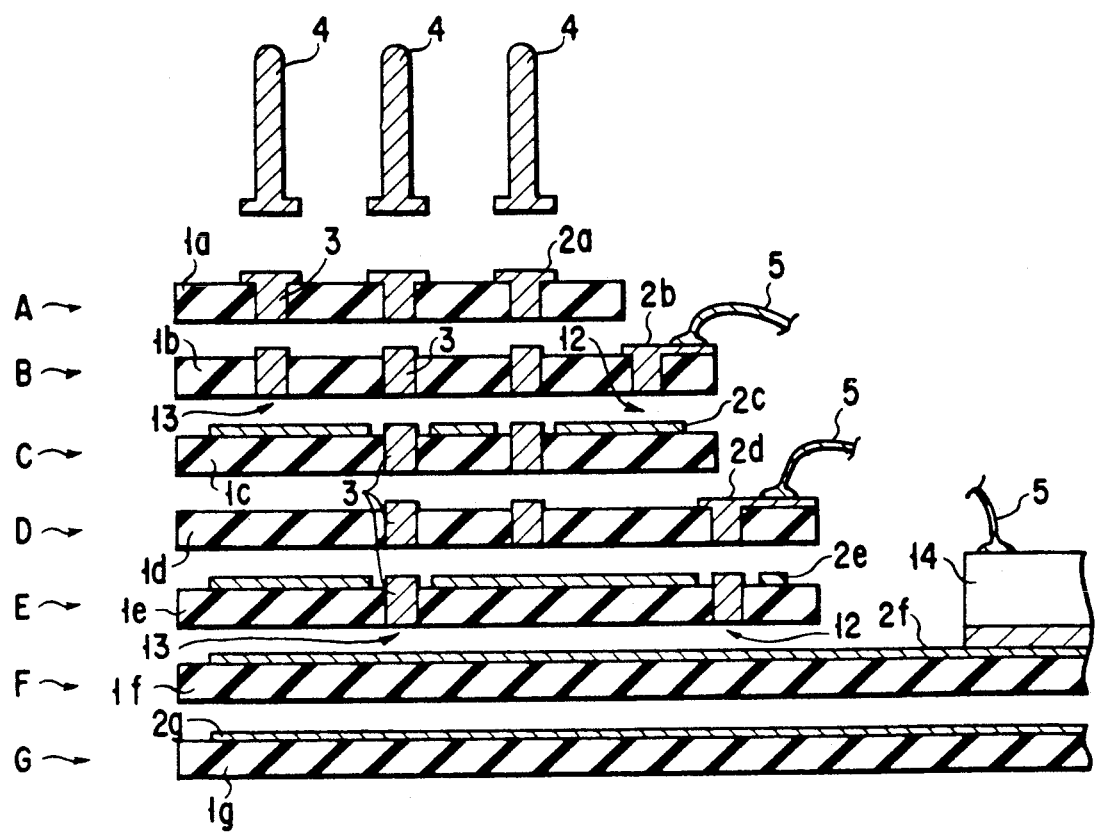
FIG. 20 is a cross sectional view of the multilayer ceramic package of FIG. 19.

FIG. 19 is an exploded perspective view showing a multilayer ceramic package according to one embodiment of the present invention. FIG. 20 is a cross sectional view of the multilayer ceramic package of FIG. 19. The package is formed of seven layers A to G. Each layer comprises plate-like ceramic substrates 1a to 1g, serving as insulating materials, and conductive layers 2a to 2g formed on the ceramic substrates 1a to 1g.

The surface of layer A forms a part of the surface of the package. A number of via holes 3 are formed in the substrate 1a. Outer leads 4 such as a signal pin, a power pin, a ground pin are formed on the conductive layers 2a.

Layers B and D are signal wiring layers. Conductive layers 2b and 2d having a predetermined wire pattern are formed on the substrates 1b and 1d. The via holes 3 are formed in the substrates 1b and 1d. The conductive layers 2b and 2d are formed in and on the corresponding via holes 3.

Layer C is a conductive layer for ground voltage $V_{SS}$. The conductive layer 2c is formed on the substrate 1c. The conductive layer 2c is shaped square and has a square hole in its central portion. The via holes 3 are formed in the substrate 1c, and the conductive layer 2c is formed on the via holes. A contact point 12 to be in contact with an inner lead 5 (bonding wire) is formed at the end portion of the inside of the conductive layer 2c. A contact point 13 to be in contact with an outer lead 4 (ground pin) is formed at the end portion of the outside of the conductive layer 2c. The positions of the contact points 12 and 13 are explained later.

Layer E is a conductive layer for power voltage $V_{DD}$. The conductive layer 2e is formed on the substrate 1e. The conductive layer 2e is shaped square and has a square hole in its central portion. The via holes 3 are formed in the substrate 1e, and the conductive layer 2e is formed on the via holes. A contact point to be in contact with an inner lead is formed at the end portion of the inside of the conductive layer 2e. A contact point 13 to be in contact with an outer lead is formed at the end portion of the outside of the conductive layer 2e. The positions of the contact points 12 and 13 are explained later.

Layer F is is a conductive layer for power voltage $V_{DD}$. The structure layer F is substantially the same the structure of layer E. The different point between layers E and F is that the conductive layer 2f is shaped square. Also, an IC chip 14 is mounted on the central portion of the conductive layer 2f.

Layer G is is a conductive layer for ground voltage $V_{SS}$. The structure layer G is substantially the same the structure of layer C. The different point between layers G and C is that the conductive layer 2g is shaped square and the surface of the substrate 1g forms the part of the surface of the package.

Figure 21:
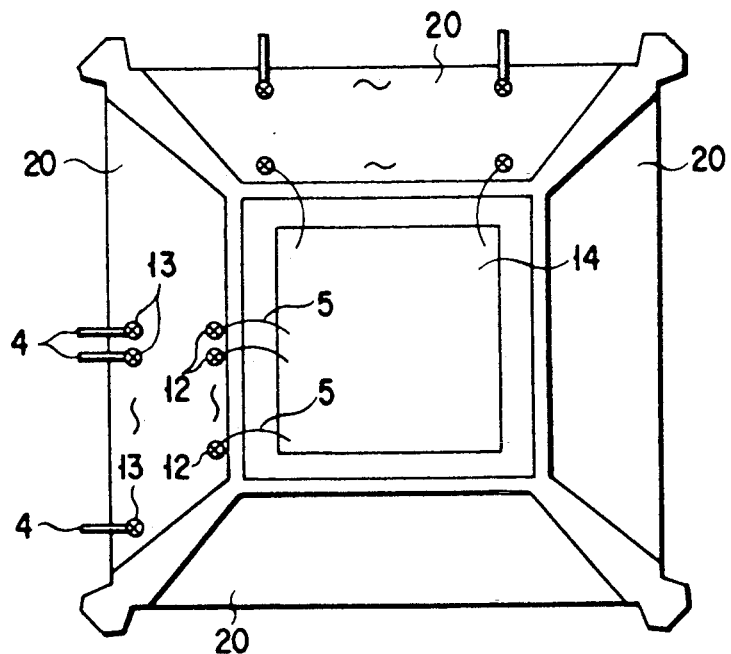
FIG. 21 is a plane view showing a multilayer plastic package according to the other embodiment of the present invention.

FIG. 21 is a plane view showing a multilayer plastic package according to the other embodiment of the present invention. FIG. 22 is a cross sectional view of the multilayer plastic package of FIG. 21. The package is formed of two layers A and B. The layer A is a conductive layer for power voltage $V_{DD}$ or ground voltage $V_{SS}$, and the layer B is mainly used as a signal wiring layer.

The layer A comprises four plate-like conductive materials 20. The IC chip 14 is surrounded by these conductive materials 20. Each conductive material 20 may be insulated from each other or short-circuited. The contact point 12 to be in contact with the inner lead 5 (bonding wire) is formed at the end portion of the IC chip side (inside) of the conductive material 20. The contact point 13 to be in contact with the outer lead 4 is formed at the end portion of the outside of the conductive material 20. The positions of the contact points 12 and 13 are explained later.

Figure 24:
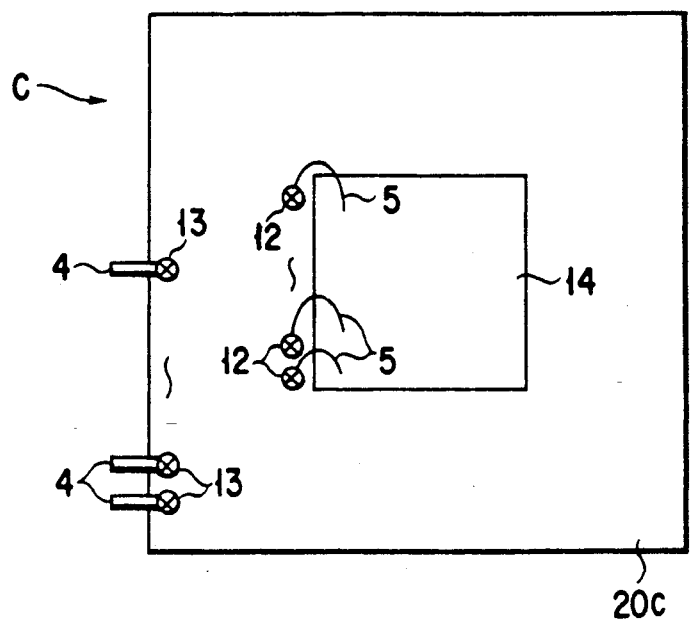
Figure 25:
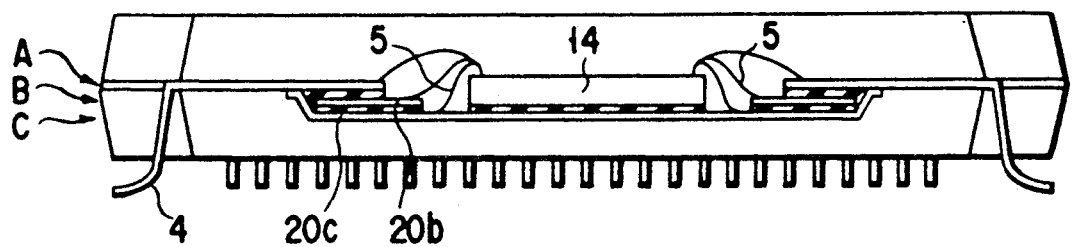
FIG. 25 is a cross sectional view of the multilayer plastic package of FIGS. 23 and 24.

FIGS. 23 and 24 are plane views showing a multilayer plastic package according to the other embodiment of the present invention. FIG. 25 is a cross sectional view of the multilayer plastic package of FIGS. 23 and 24. The package is formed of three layers A, B, and C. The layer A is a lead layer for signal or power voltage $V_{DD}$/ground voltage $V_{SS}$. The layers B and C are conductive layers for power voltage $V_{DD}$ or ground voltage $V_{SS}$.

The layer B comprises a plate-like conductive material 20b having a square hole in its central portion. The IC chip 14 is positioned at the central portion of the hole. The contact point 12 to be in contact with the inner lead 5 (bonding wire) is formed at the end portion of the IC chip side (inside) of the conductive material 20b. The contact point 13 to be in contact with the outer lead 4 is formed at the end portion of the outside of the conductive material 20b. The positions of the contact points 12 and 13 are explained later.

The layer C comprises a square plate-like conductive material 20c. The IC chip 14 is positioned at the central portion of the conductive material 20c. The contact point 12 to be in contact with the inner lead 5 (bonding wire) is formed at the end portion of the IC chip side (inside) of the conductive material 20c. The contact point 13 to be in contact with the outer lead 4 is formed at the end portion of the outside of the conductive material 20c. The positions of the contact points 12 and 13 are explained later.

The following will explain the positions of the contact points 12 and 13 on the conductive layer for power voltage $V_{DD}$ or ground voltage $V_{SS}$ of the multilayer ceramic package, and the positions of the contact points 12 and 13 on the conductive layer for power voltage $V_{DD}$ and ground voltage $V_{SS}$ of the multilayer plastic package.

Figure 1:
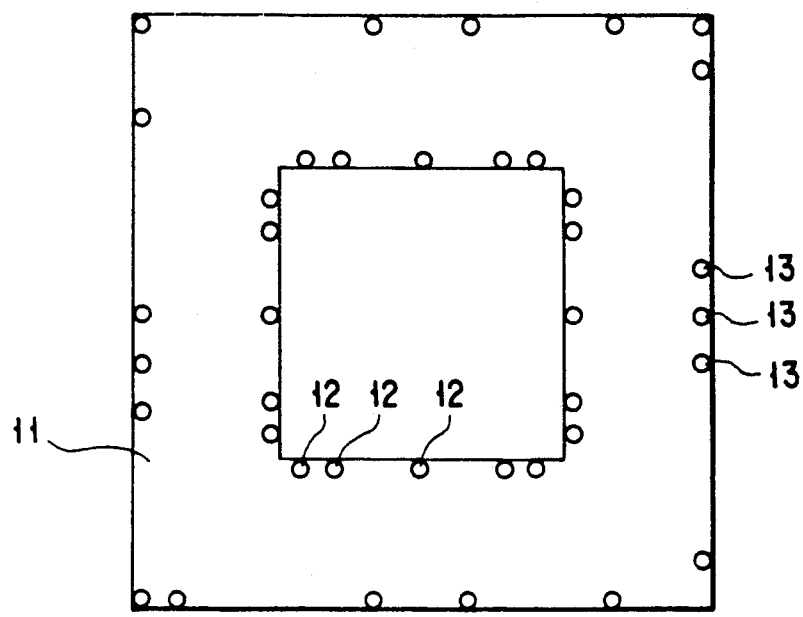
FIG. 1 is a plane view of a conventional conductive layer.
Figure 2:
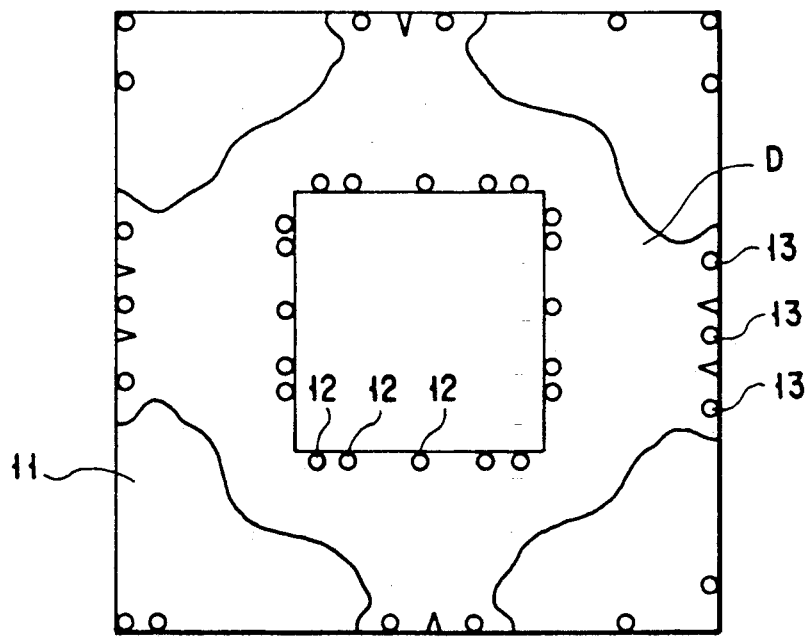
FIG. 2 is a view showing a distribution of current density in the conductive layer of FIG. 1.

Increase in simultaneous switching noise results from increase in inductance of the conductor for the power voltage $V_{DD}$ or the ground voltage $V_{SS}$ of the multilayer ceramic package. As shown in FIG. 1, according to the conventional package, the contact point 12 between the conductive layer 11 and the inner lead and the contact point 13 between the conductive layer 11 and the outer lead are irregularly determined, respectively. Due to this, the distribution of current density in the conductive layer 11 becomes uneven, and inductance of the conductive layer 11 increases.

The present invention provides a multilayer ceramic package wherein distribution of current density in the conductive layer is substantially uniformed. In other words, according to the present invention, attention is paid to the point that conductive resistance and inductance becomes minimum when distribution of current density in the conductive layer is uniformed. Therefore, in the present invention, distribution of current density in the conductive layer is set to be substantially uniformed, thereby the simultaneous switching noise is reduced.

In order to equalize the distribution of current density in the conductive layer, first, a relationship between the number of leads and inductance must be reviewed. FIG. 3 shows the relationship between the number of leads and inductance. As is obvious from FIG. 3, inductance reduces as the number of leads increases (the distances among leads are narrowed), and inductance reaches close to a logical value. The following conditions can be obtained from the analyzed result of the distribution of current density.

A) First Condition

"A distance from one contact point of the inner lead to one contact point of the outer lead is the shortest distance." That is, the distance from one contact point of the inner lead to one contact point of the outer lead is set to be as short as possible, so that a current passage is made short. This condition is derived from the reason that conductor resistance of the conductive layer and self inductance are increased in proportion to the distance (length of the current passage) from one contact point of the inner lead to one contact point of the outer lead.

B) Second Condition

"The number of contact points of the inner lead is equal to that of the contact points of the outer lead, and these points are regularly arranged."

That is, the contact points of the inner lead and those of the outer lead are symmetically arranged. This condition is derived from the reason that the phenomenon of the local concentration of the current distribution and that of the ununiformity of the current distribution are generated by the point that the contact points are arranged at random.

C) Third Condition

The distance between the nearest neighboring two first contact points is ⅔ or less of the shortest distance from one first contact point to one second contact point, wherein each first contact point is between the conductive layer and the inner lead.

Similarly, the distance between the nearest neighboring two second contact points is ⅔ or less of the shortest distance from one first contact point to one second contact point, wherein each second contact points is between the conductive layer and the outer lead.

The above condition is derived from the reason that if each current density of the currents flowing from adjacent two contact points of the inner lead becomes half at a portion where the currents cross the substantially equal distribution of current density can be obtained in the conductive layer.

The portion where the current density becomes half can be obtained by an electric image method from the following equation (1).

$$W = \{(4 \times h^6)^{\frac{1}{3}} - h^2\}^{\frac{1}{2}} \approx 0.766 \cdot h \approx (\tfrac{3}{4}) \cdot h \qquad (1)$$

wherein W a distance between the nearest neighboring two contact points, h is the shortest distance from one contact point of the inner lead to one contact point of the outer lead.

According to the above condition, the distribution of current density at the intermediate point between the contact point of the inner lead and that of the outer lead is uniformed.

The above condition is derived from the results of the measurement and analysis. That is, the distribution of current density in the conductive layer is uniformed when the area where current uniformly flows amounts to more than a half area of the whole conductive layer.

The space of the contact points to satisfy the above condition according to the electric image method is shown as the following equation (2):

$$W \leq 2 \times (\tfrac{3}{4}) \times (\tfrac{1}{2}) \times \{(\tfrac{1}{2}) \times h\} \leq (\tfrac{3}{4}) \cdot h \qquad (2)$$

wherein W is a distance between the nearest neighboring two contact points, h is the shortest distance from one contact point of the inner lead to one contact point of the outer lead.

According to the multilayer ceramic package satisfying at least one of the above first to fourth conditions, the distribution of current density in the conductive layer for the power voltage $V_{DD}$ or ground voltage $V_{SS}$ can be uniformed. Thereby, conductor resistance of the conductive layer and inductance can be reduced and simultaneous switching noise can be also reduced.

In the case where the present invention is applied to the ceramic pin grid array package, the pin pitch can be 50 mil or less and the number of pins can be 300 or more. Moreover, In the case where the present invention is applied to the ceramic flat package, the lead pitch can be 25 mil or less and the number of leads can be 300 or more.

FIGS. 4A and 4B show a conductive layer of a multilayer ceramic package according to one embodiment of the present invention. In FIGS. 4A and 4B, reference numeral 11 is a conductive layer, 12 is a contact point between the inner lead and the conductive layer; $C_1$ is a distance between the nearest neighboring two contact points 12 (excepting corner portions). Reference numeral 13 is a contact point between the outer lead and the conductive layer and $C_2$ is a distance between the nearest neighboring two contact points 13 (excepting corner portions).

The package of FIG. 4 is structured to satisfy the above first and third conditions. That is, the distance $C_1$ between the nearest neighboring two contact points 12 is ⅔ or less of the shortest distance h from one contact point of the inner lead to one contact point of the outer lead. Similarly, the distance $C_2$ between the nearest neighboring two contact points 13 is ⅔ or less of the shortest distance h from one contact point of the inner lead to one contact point of the outer lead.

FIG. 5 shows the distribution of current density in the conductive layer 11 of the multilayer ceramic package of FIG. 4A. In FIG. 5, D is an area where the current concentrates. As is obvious from the drawing, according to the present invention, the distribution of current density in the conductive layer 11 is more uniformed compared with the prior art. Therefore, the conductor resistance of the conductive layer and inductance can be reduced and simultaneous switching noise can be also reduced.

FIGS. 6A to 18A and FIGS. 6B to 18B show the multilayer ceramic packages according to the other embodiments of the present invention.

Figure 6A:
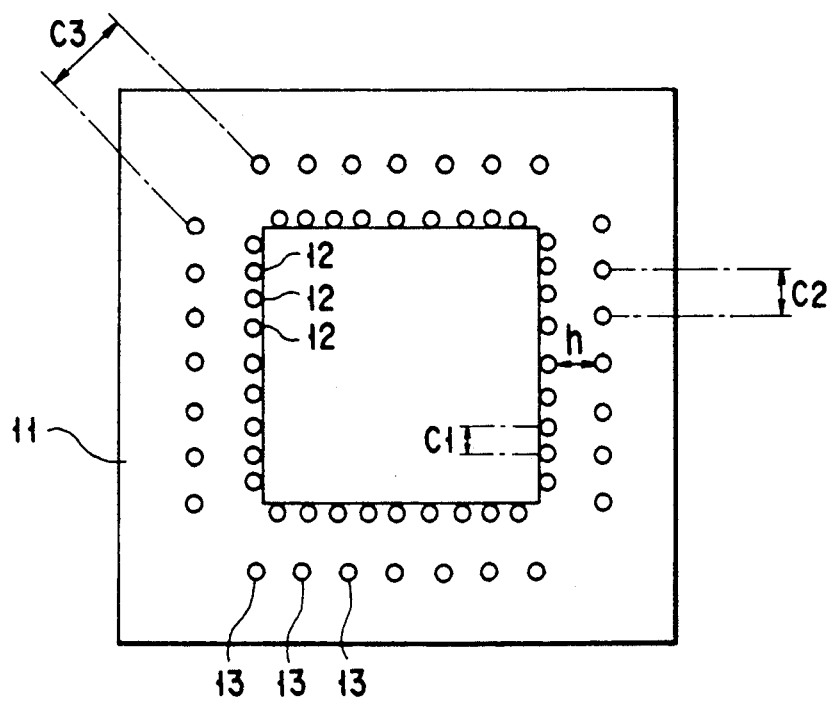
Figure 6B:
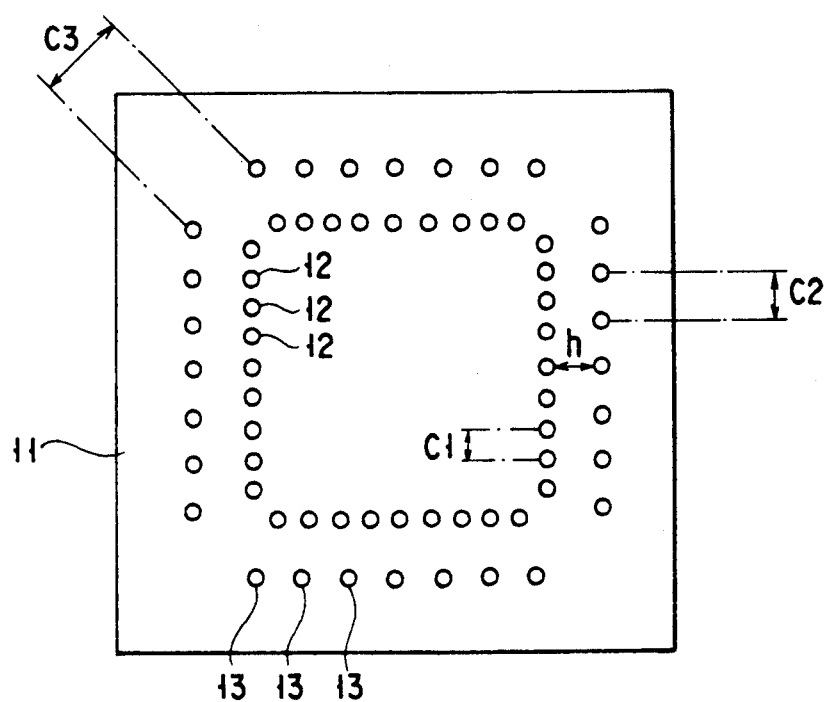

Similar to the package of FIGS. 4A and 4B, the package of FIGS. 6A and 6B are structured to satisfy the above condition. All contact points 13 are arranged in the portions closer to the contact points 12 at the portions, which are not end portions of the conductive layer 11, for example, within an allowable range, which is determined every package. According to this structure, the distance $C_3$ between the contact points 13 at the corner portions of the conductive layer 11 can be narrowed. Moreover, in addition to the same technical advantage as the package of FIGS. 4A and 4B, the current passage can be shorten. Thereby, the conductor resistance of the conductive layer and inductance can be reduced and simultaneous switching noise can be also reduced.

Figure 7B:
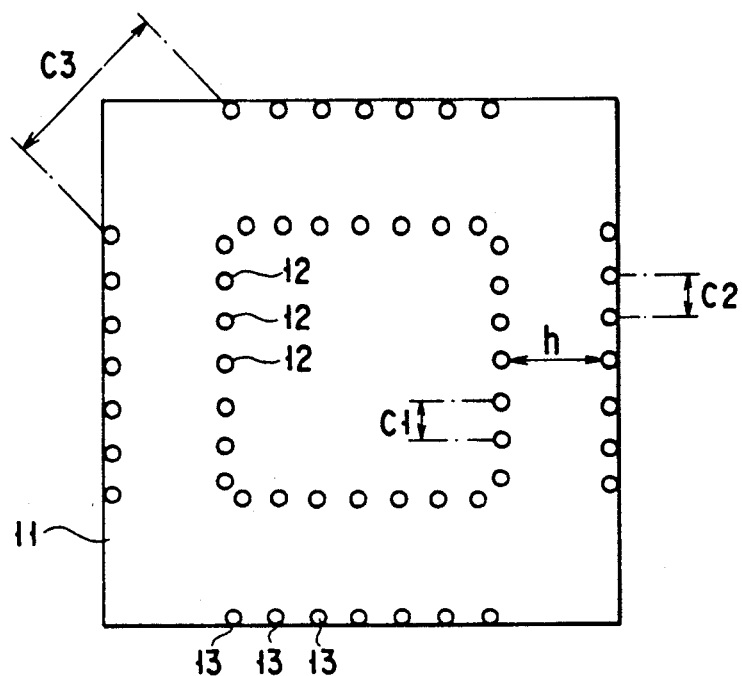

The package of FIGS. 7A and 7B is structured to satisfy all first to third conditions. More specifically, the distance $C_1$ between the nearest neighboring two contact points 12 is $\frac{3}{8}$ or less of the shortest distance h from one contact point of the inner lead to one contact point of the outer lead. Similarly, the distance $C_2$ between the nearest neighboring two contact points 13 is $\frac{3}{8}$ or less of the shortest distance h from one contact point of the inner lead to one contact point of the outer lead. The number of contact points 12 is equal to that of contact points 13.

In this package, one contact point 12 pairs with one contact point 13. The pair of contact points 12 and 13 are arranged to be opposed to each other with a shortest distance. According to this structure, in addition to the same technical advantage as the package of FIGS. 4A and 4B, the potential distribution is symmetrized, so that ununiformity of the distribution of current density can be reduced. Thereby, the conductor resistance of the conductive layer and inductance can be reduced.

Figure 8B:
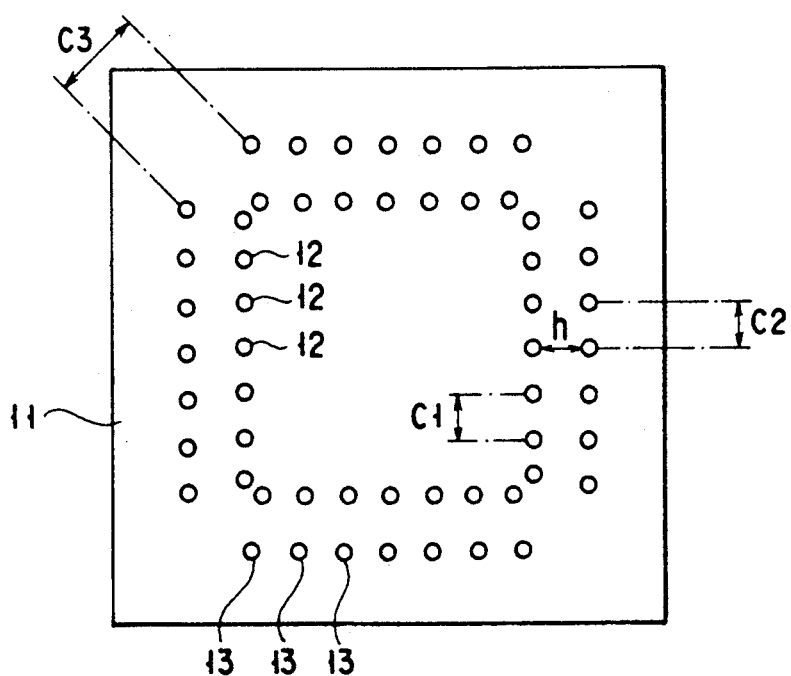

Similar to the package of FIGS. 7A and 7B, the package of FIGS. 8A and 8B is structured to satisfy all first to third conditions. The contact points 13 are arranged in the portions closer to the contact points 12 at the portions, which are not end portions of the conductive layer 11, for example, within an allowable range, which is determined every package. According to this structure, the distance $C_3$ between the contact points 13 at the corner portions of the conductive layer 11 can be narrowed. Moreover, in addition to the same technical advantage as the package of FIGS. 7A and 7B, the current passage can be shorten. Thereby, the conductor resistance of the conductive layer and inductance can be reduced and simultaneous switching noise can be also reduced.

Figure 9A:
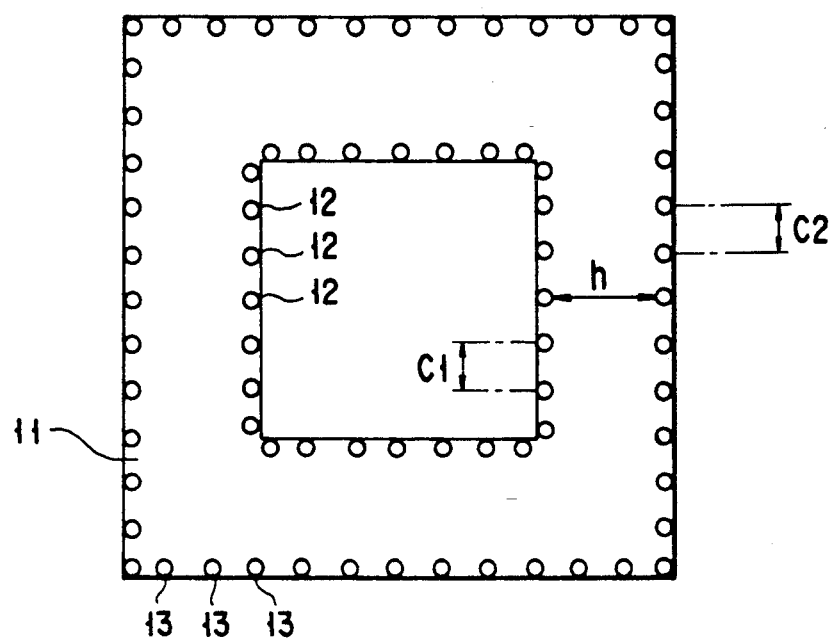

The package of FIGS. 9A and 9B is structured to satisfy the first and third conditions. More specifically, the distance $C_2$ between the adjacent two contact points 13 is $\frac{3}{8}$ or less of the shortest distance h from one contact point of the inner lead to one contact point of the outer lead. According to this structure, in addition to the same technical advantage as the package of FIGS. 4A and 4B, the uniform area of the distribution of current density is enlarged. Thereby, the conductor resistance of the conductive layer and inductance can be reduced and simultaneous switching noise can be also reduced.

Figure 10A:
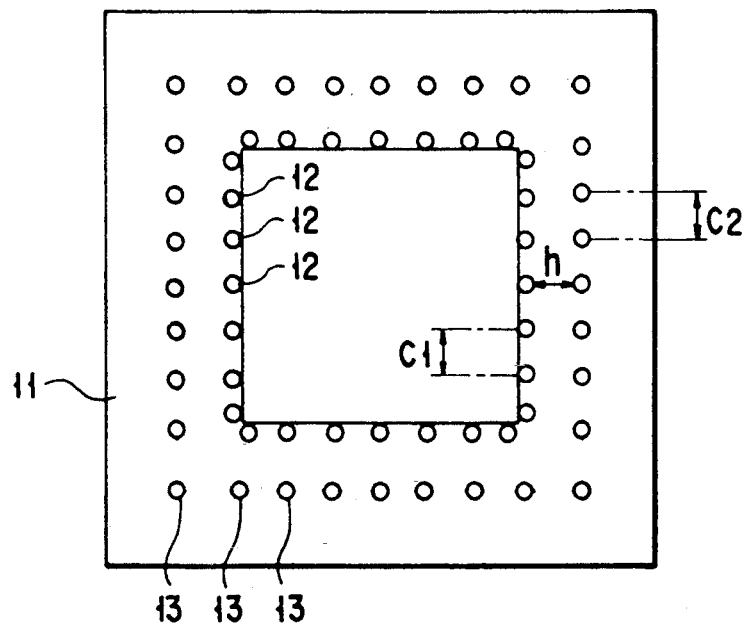

Similar to the package of FIGS. 9A and 9B, the package of FIGS. 10A and 10B is structured to satisfy the first and third conditions. The contact points 13 are arranged in the portions closer to the contact points 12 at the portions which are not end portions of the conductive layer 11, for example, within an allowable range, which is determined every package.

The package of FIGS. 11A and 11B is structured to satisfy all first to third conditions. More specifically, the distance $C_1$ between the nearest neighboring two contact points 12 is $\frac{3}{8}$ or less of the shortest distance h from one contact point of the inner lead to one contact point of the outer lead. Similarly, the distance $C_2$ between the nearest neighboring two contact points 13 is $\frac{3}{8}$ or less of the shortest distance h from one contact point of the inner lead to one contact point of the outer lead. The number of contact points 12 is equal to that of contact points 13.

Figure 13A:
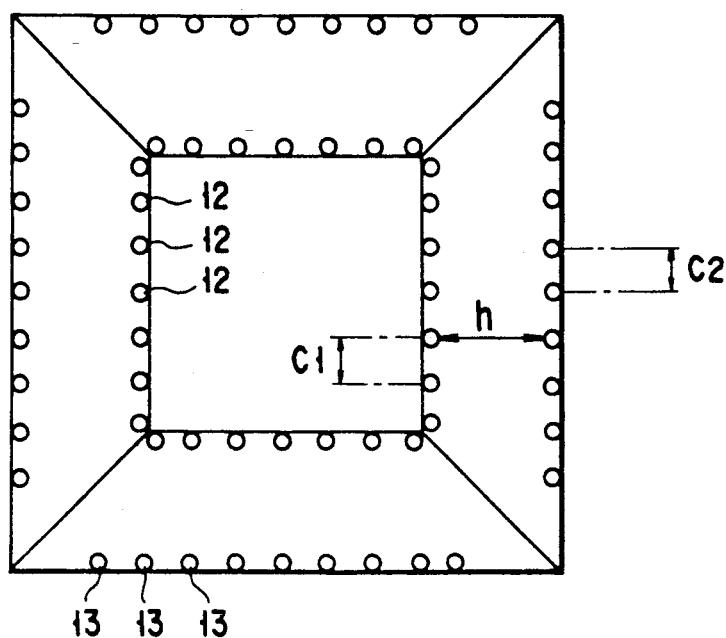
Figure 13B:
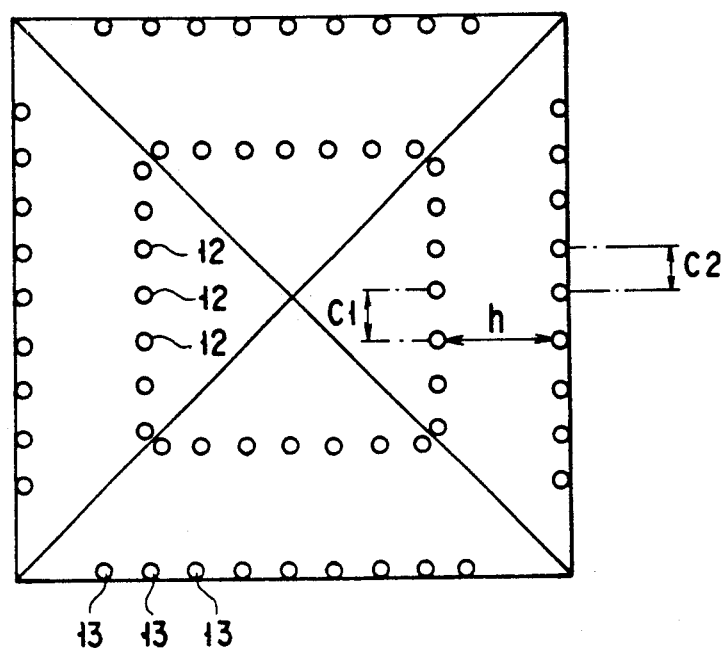

Similar to the package of FIGS. 10A and 10B, the package of FIGS. 12A and 12B is structured to satisfy the first to third conditions. The contact points 13 are arranged in the portions closer to the contact points 12 at the portions, which are not end portions of the conductive layer 11, for example, within an allowable range, which is determined every package. In the packages of FIGS. 13A to 16A and 13B to 16B, the conductive layer 11 is formed of four insulated parts. As a result, since each part does not influence the other parts, the uniformity of the distribution of current density of each part can be improved. In the package of FIG. 13A, the conductive layer 11 of FIG. 4A is formed of four parts. In the package of FIG. 13B, the conductive layer 11 of FIG. 4B is formed of four parts.

Figure 14A:
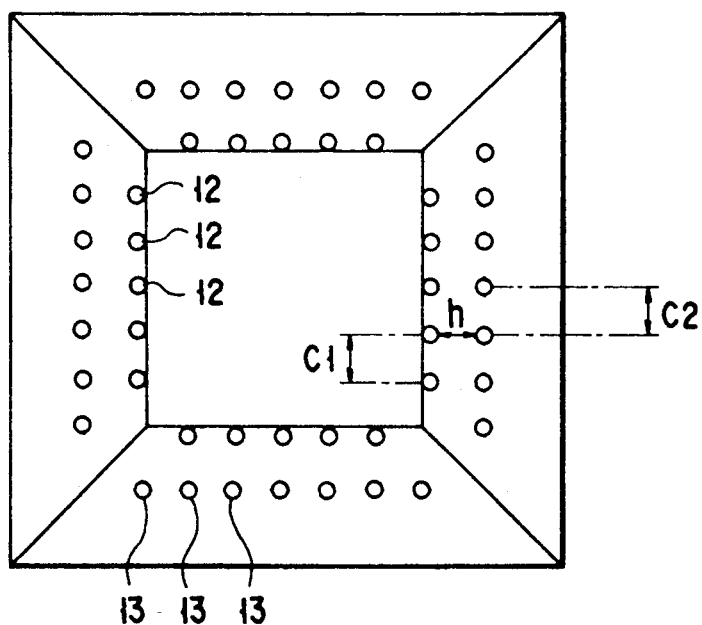
Figure 14B:
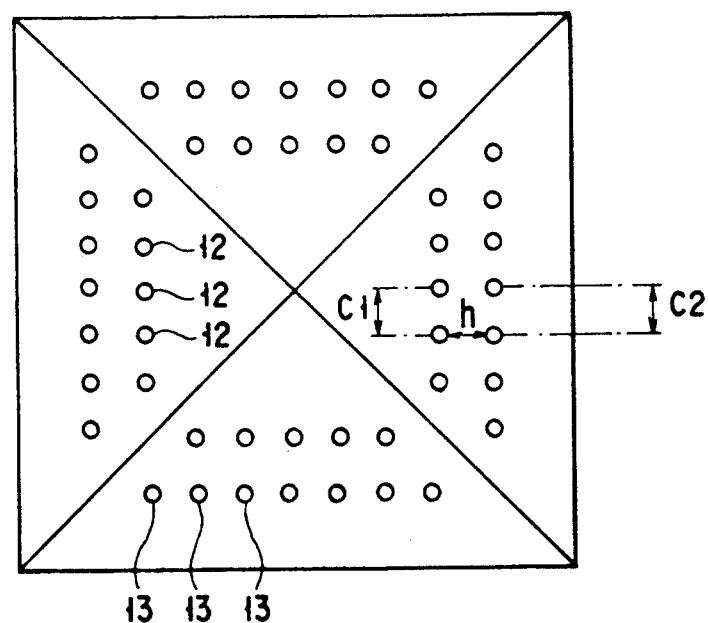
Figure 15B:
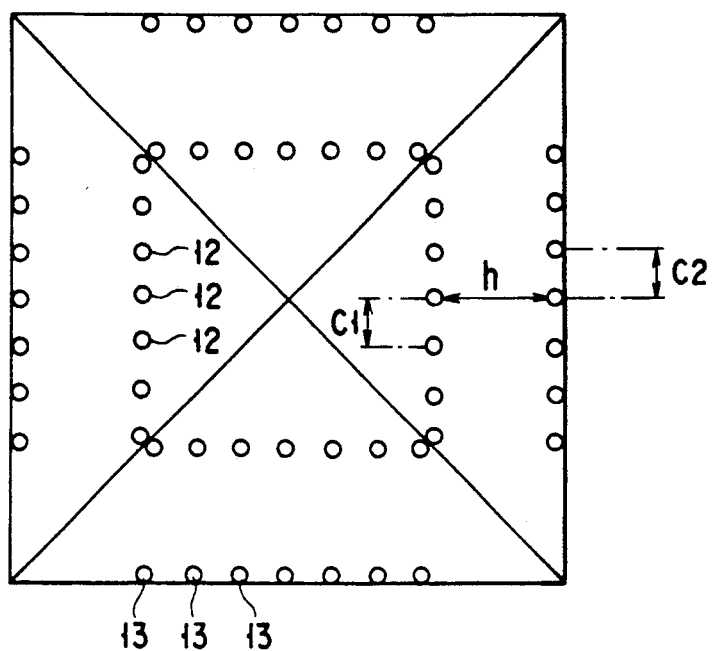
Figure 16B:
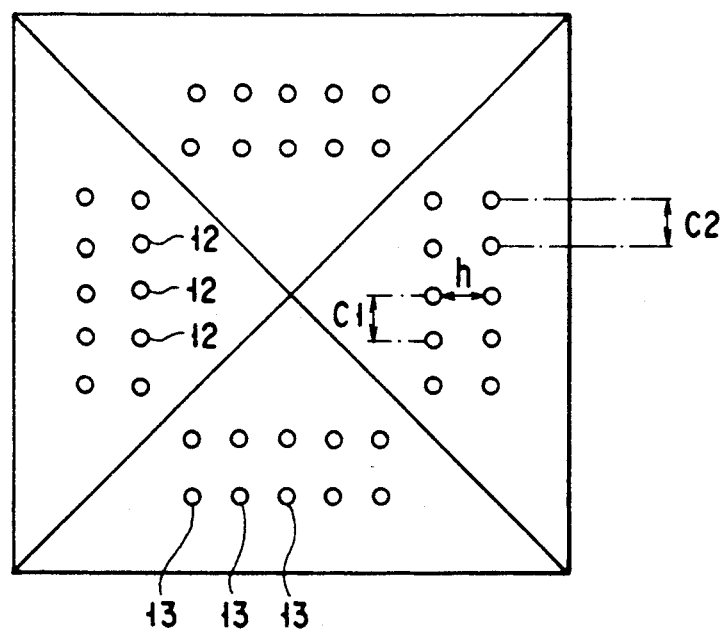

In the package of FIG. 14A, the conductive layer 11 of FIG. 6A is formed of four parts. In the package of FIG. 14B, the conductive layer 11 of FIG. 6B is formed of four parts. In the package of FIG. 15A, the conductive layer 11 of FIG. 7A is formed of four parts. In the package of FIG. 15B, the conductive layer 11 of FIG. 7B is formed of four parts. In the package of FIG. 16A, the conductive layer 11 of FIG. 8A is formed of four parts. In the package of FIG. 16B, the conductive layer 11 of FIG. 8B is formed of four parts.

Figure 17:
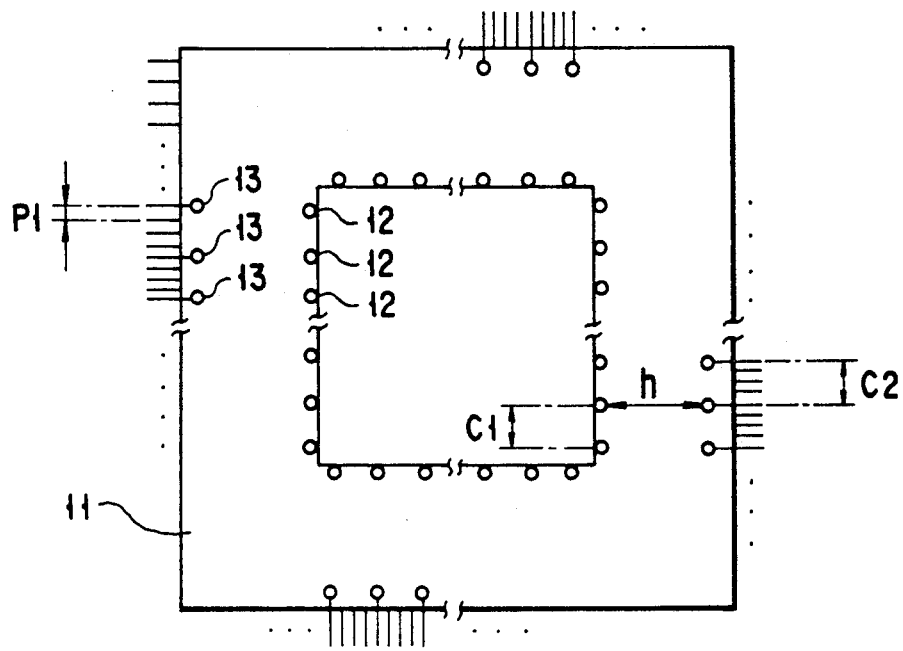

FIG. 17 shows a conductive layer for power voltage $V_{DD}$ of the ceramic flat package in which lead pitch $P_1$ is 25 [mil] and the number of leads is 300 or more. The distance $C_1$ between the nearest neighboring two contact points 12 is set to $\frac{3}{8}$ or less of the shortest distance h from one contact point of the inner lead to one contact point of the outer lead. Similarly, the distance $C_2$ between the nearest neighboring two contact points 13 is set to $\frac{3}{8}$ or less of the shortest distance h from one contact point of the inner lead to one contact point of the outer lead. The number of contact points 12 is equal to that of contact points 13.

Figure 18:
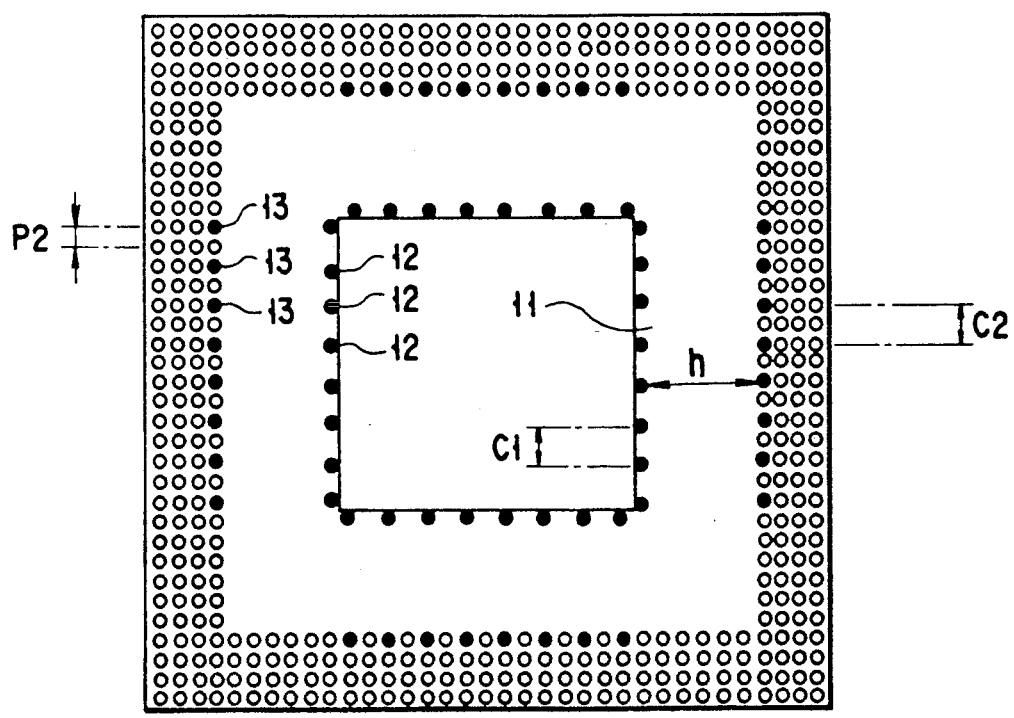

FIG. 18 shows a conductive layer for power voltage $V_{DD}$ of the ceramic pin grid array package in which lead pitch $P_2$ is 50 [mil] and the number of pins is 300 or more. The distance $C_1$ between the nearest neighboring two contact points 12 is set to $\frac{3}{8}$ or less of the shortest distance h from one contact point of the inner lead to one contact point of the outer lead. Similarly, the distance $C_2$ between the nearest neighboring two contact points 13 is set to $\frac{3}{8}$ or less of the shortest distance h from one contact point of the inner lead to one contact point of the outer lead. The number of contact points 12 is equal to that of contact points 13. The contact points 13 are arranged at the portions other than the end portions of the conductive layer 11, such as central portion of the conductive layer.

According to the semiconductor devices of FIGS. 17 and 18, since the potential distribution is symmetrized, the distribution of current density can be uniformed, and the simultaneous switching noise of the package having a large number of pins can be reduced.

In the above embodiments, the distance $C_1$ between contact points 12 is set to be, for example, less than 100 [mil], and the distance $C_2$ between contact points 13 is set to be, for example, less than 100 [mil]. Each contact point 12 of the inner lead includes a via hole to be connected to an inner bonding pad or a bonding pad and a contact point between a bonding wire or TAB and the conductive layer. Each contact point 13 of the outer lead includes an outer pin of the package, a contact point between an outer lead of the package and the conductive layer, a via hole to be connected to the pin or the lead.

The conductive layer 11 can be formed of conductive material such as copper and tungsten. Regarding the conductive layer 11, the flat plate-like, mesh, layered, or thin-layer conductive layer may be used. Regarding the shape, a square or rectangular conductive layer can be considered. According to the package of the present invention, in particular, if the frequency of the output signal in the output buffer is 50 [MHz] or more ($\geq$), delay of the output signal can be improved.

Table 1 shows the technical advantage of the present invention. According to the package of the present invention, as compared with the conventional package, the conductor resistance and inductance can be reduced by 20% or more, and simultaneous switching noise can be reduced. In Table 1, the conductive layer of FIG. 4 is used in the package of the present invention and the conductive layer of FIG. 1 is used in the conventional package.

TABLE 1

|  | Conventional Package | Package of Present Invention |
| --- | --- | --- |
| Resistance [m$\Omega$] | 17.3 | 16.4 |
| Inductance [nH] | 5.01 | 3.80 |

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:
1. A multilayer package, comprising:
   a semiconductor device;
   a conductive layer applying a power voltage $V_{DD}$ or a ground voltage $V_{SS}$ to said semiconductor device;
   a plurality of inner leads having one end connected to said conductive layer at the inner portion of said conductive layer and other end connected to said semiconductor device; and
   a plurality of outer leads having one end connected to said conductive layer at the outer portion of said conductive layer, wherein a first contact point between said conductive layer and each inner lead and a second contact point between said conductive layer and each outer lead are arranged to satisfy at least the following relationship:
   both ($C_1$/h) and ($C_2$/h) are ($\frac{2}{3}$) or less where a distance between nearest neighboring two first contact points is $C_1$ and a distance between nearest neighboring two second contact points is $C_2$, and the shortest distance from the first contact point to the second contact point is h.

2. The multilayer package according to claim 1, wherein the number of said first contact points is equal to that of said second contact points.
3. The multilayer package according to claim 1, wherein one end of each inner lead is connected to said conductive layer at one end portion of the inside of said conductive layer.
4. The multilayer package according to claim 1, wherein one end of each outer lead is connected to said conductive layer at one end portion of the outside of said conductive layer.
5. The multilayer package according to claim 1, wherein one end of each outer lead is connected to said conductive layer at a position where said one end extends inside by a predetermined distance from the end portion of the outside of said conductive layer.
6. The multilayer package according to claim 1, wherein said conductive layer is formed of a plate-like insulating substrate and a conductive layer formed on said insulating substrate.
7. The multilayer package according to claim 6, wherein said plate-like insulating substrate and conductive layer are shaped square.
8. The multilayer package according to claim 7, wherein a semiconductor device is mounted on a central portion of said conductive layer.
9. The multilayer package according to claim 6, wherein each of said plate-like insulating substrate and said conductive layer is shaped square and has a square hole in its central portion.
10. The multilayer package according to claim 1, wherein said conductive layer is formed of a plate-like conductive material.
11. The multilayer package according to claim 10, wherein said plate-like conductive material is shaped square.
12. The multilayer package according to claim 10, wherein a semiconductor device is mounted on a central portion of said conductive material.
13. The multilayer package according to claim 10, wherein said plate-like conductive material is shaped square and has a square hole in its central portion.
14. The multilayer package according to claim 1, wherein said conductive layer is formed of a plurality of parts, and each part is formed around said semiconductor device.
15. The multilayer package according to claim 1, wherein said multilayer package has 300 or more outer leads.
16. The multilayer package according to claim 1, wherein said multilayer package is used in a case where a frequency of an output signal in an output buffer formed in said semiconductor device is 50 [MHz] or more.
17. The multilayer package according to claim 1, wherein one of said first contact point and one of said second contact point are paired, and said first and second contact points are opposed to each other with the shortest distance.
18. The multilayer package according to claim 1, wherein said respective parts of said conductive layer are insulated from each other.
19. The multilayer package according to claim 1, wherein said first contact points are linearly arranged, said second contact points are also linearly arranged.
20. The multilayer package according to claim 1, wherein said first contact points are linearly arranged, said second contact points are also linearly arranged, and said first contact points and said second contact points are parallel to each other.

21. The multilayer package according to claim 10, wherein said first contact points are linearly arranged, said second contact points are also linearly arranged, said first contact points and said second contact points are parallel to each other, and said first contact points and said second contact points are parallel to at least one side of the inner side and the outer side of said plate-like conductive material.

* * * * *